United States Patent
Drouere et al.

(10) Patent No.: US 10,545,184 B2
(45) Date of Patent: Jan. 28, 2020

(54) DIRECTIONAL DETECTION OF EARTH FAULTS IN AN ELECTRICAL DISTRIBUTION NETWORK

(71) Applicant: Schneider Electric Industries SAS, Rueil Malmaison (FR)

(72) Inventors: Bernard Drouere, Apprieu (FR); Julien Mecreant, Seyssinet (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 388 days.

(21) Appl. No.: 14/865,635

(22) Filed: Sep. 25, 2015

(65) Prior Publication Data

US 2016/0091555 A1    Mar. 31, 2016

(30) Foreign Application Priority Data

Sep. 29, 2014  (FR) ...................................... 14 59194

(51) Int. Cl.
  *G01R 31/08*  (2006.01)
  *G01R 25/00*  (2006.01)
  (Continued)

(52) U.S. Cl.
  CPC ............. *G01R 31/08* (2013.01); *G01R 25/00* (2013.01)

(58) Field of Classification Search
  None
  See application file for complete search history.

(56) References Cited

U.S. PATENT DOCUMENTS 3,747,104 A * 7/1973 Pansini .................... G01S 1/02
  342/457
4,728,948 A * 3/1988 Fields ...................... H02H 3/04
  340/3.71

(Continued)

FOREIGN PATENT DOCUMENTS

EP    0 591 011 A1    4/1994
EP    0 845 846 A1    6/1998

(Continued)

OTHER PUBLICATIONS

Fault Location Analysis of Ungrounded Distribution System Based on Residual; Mitsubishi Electric Corporation Hyogo 661-8661 Japan Sun, H.; Nikovski, D.; Takano, T.; Kojima, Y.; Ohno, T. TR2013-089 Sep. 2013 Voltage Distribution.*

(Continued)

*Primary Examiner* — Herve-Louis Y Assouman
(74) *Attorney, Agent, or Firm* — Oblon, McClelland, Maier & Neustadt, L.L.P.

(57) ABSTRACT

Method for the directional determination of an earth fault in an electric power distribution network, characterised in that it comprises the steps of:
  Determining (E2) a residual current phasor and a residual voltage phasor,
  Determining (E3) an active current,
  Comparing (E7) the residual voltage phasor module with a threshold (SVR), and
  as long as the residual voltage phasor module remains higher than the threshold (SVR) or a fraction of the threshold (SVR), and for a predetermined number of iterations:
  Determining (E9, E12) the integral of the active current and of its sign, (Continued)

Determining the number of times when the residual current phasor module is greater than a predetermined threshold (SIR), during the predetermined number of iterations, If the residual current phasor module is greater than the predetermined threshold (SIR) at least one time, during the predetermined number of iterations, Determining (E16) the location upstream or downstream of the fault according to the number of times when the sign of the integral of the active current was positive or negative during the predetermined number of iterations.

10 Claims, 4 Drawing Sheets

(51) Int. Cl.
*G01R 31/02* (2006.01)
*G01R 19/25* (2006.01)
*H01H 3/16* (2006.01)
*H01H 3/40* (2006.01)

(56) References Cited

U.S. PATENT DOCUMENTS

| | | | |
|---|---|---|---|
| 5,661,664 A | 8/1997 | Novosel et al. | |
| 6,018,455 A * | 1/2000 | Wilkie, II | H02B 1/21 165/80.3 |
| 6,064,001 A * | 5/2000 | Ulerich | H01H 71/0271 174/50 |
| 2004/0085074 A1 * | 5/2004 | Kereit | G01R 31/025 324/512 |
| 2005/0018371 A1 * | 1/2005 | Mladenik | H02H 3/00 361/78 |
| 2010/0277181 A1 * | 11/2010 | Saha | G01R 31/088 324/521 |
| 2010/0301872 A1 | 12/2010 | Kereit et al. | |
| 2011/0068802 A1 * | 3/2011 | Roscoe | H02H 3/331 324/509 |
| 2012/0123708 A1 * | 5/2012 | Dong | G01R 31/025 702/58 |
| 2012/0296491 A1 * | 11/2012 | Schmid | H02J 3/16 700/298 |

FOREIGN PATENT DOCUMENTS

| | | | | |
|---|---|---|---|---|
| EP | 2 306 609 A2 | 4/2011 | | |
| EP | 2 533 060 A1 | 12/2012 | | |
| EP | 2533060 A1 * | 12/2012 | | H02H 5/10 |
| EP | 2 624 397 A1 | 8/2013 | | |

OTHER PUBLICATIONS

U.S. Appl. No. 14/863,695, filed Sep. 24, 2015, Bernard Drouere et al.

French Preliminary Search Report dated Jun. 17, 2015 in French Application 14 59194, filed on Sep. 29, 2014 ( with English Translation of categories of Cited Documents).

* cited by examiner

DIRECTIONAL DETECTION OF EARTH FAULTS IN AN ELECTRICAL DISTRIBUTION NETWORK

TECHNICAL FIELD

This invention relates to the directional detection of an earth fault in an electric power distribution network. It aims to detect an earth fault and to determine if the fault detected is located upstream or downstream of the point of detection.

PRIOR ART

Devices for detecting earth faults are in particular used in three-phase electric power distribution networks.

Document EP 0 591 011 proposes a device for detecting faults on an underground electric power distribution network. This device carries out a detection of the transient changes of the homopolar current by comparing the sign of the homopolar current with that of the homopolar voltage. This technique requires a high sampling frequency in order to guarantee a good detection of the direction, in the first milliseconds following the appearance of the earth fault in compensated neutral networks, on the fault passage indicators (FPI) downstream of the fault.

Document EP 0 845 846 proposes a device for detecting faults on electric power lines. This device compares the sign of the homopolar voltage transients with the sign of the integral of the homopolar current transients. This technique requires a high sampling frequency in order to guarantee a good detection of the direction, in the first period quarter following the appearance of the earth fault in compensated neutral networks, on the FPIs downstream of the fault.

Document EP 2 624 397 proposes a device for detecting the direction of a fault (phase/earth or between phases) in a three-phase electric network.

This device uses a cumulative sum of vectors representing electrical magnitudes such as impedance, admittance, power or current, possibly represented by their symmetrical components. For phase/earth faults, the homopolar component of the electrical magnitudes impedance, admittance, power, voltage and current is used. The vector is constituted either of the DFT (Discrete Fourier Transform) of the basic component, or of the sum of the DFTs of the harmonics.

Most protective relays use the DFTs of the residual current and of the residual voltage, at the fundamental frequency of the network, in order to carry out a projection of the residual current on a polarisation voltage developed using the residual voltage and a characteristic angle, adapted to the neutral point.

The real part of the projected current is compared to a threshold Iso, negative for the faults downstream of the protective relay and positive for the faults upstream of the protective relay.

This technique requires either adapting the characteristic angle to the neutral point, or implementing as many instances as there are neutral points (compensated and/or isolated, as in Italy).

When the characteristic angle is equal to 0°, the real part of the projection is commonly defined as the active current; when it is equal to 90°, this is the reactive current.

This technique has the disadvantage of not providing for the maintaining of the instantaneous bit in the first period of the electrical network (projected IR>Iso), in compensated and isolated neutral networks, on the FPIs downstream of the fault.

EXPOSURE OF THE INVENTION

The invention aims to overcome the problems of prior art by providing a method for the directional determination of an earth fault in an electric power distribution network, characterised in that it comprises the steps of:
  Determining a residual current phasor,
  Determining a residual voltage phasor,
  Determining an active current by projection of the residual current phasor on the residual voltage phasor,
  Determining the residual voltage phasor module,
  Comparing the residual voltage phasor module with a threshold,
  and in that it comprises the following steps, as long as the residual voltage phasor module remains greater than the threshold or greater than a fraction of the threshold, and for a predetermined number of iterations starting from the moment when the residual voltage phasor module is greater than the threshold:
  Determining the integral of the active current and of the sign of the integral of the active current,
  Determining the residual current phasor module,
  Determining the number of times when the residual current phasor module is greater than a predetermined threshold, during the predetermined number of iterations,
  If the residual current phasor module is greater than the predetermined threshold at least one time, during the predetermined number of iterations,
  Determining the location upstream or downstream of the fault according to the number of times where the sign of the integral of the active current was positive or negative during the predetermined number of iterations.

Thanks to the invention, the directional detection of an earth fault is not specific to a particular network configuration or to different parameters of the network. As such, the directional detection of the earth fault can be used:
  on all neutral points, for example isolated, by limiting impedance, by compensation impedance with or sans active current,
  on electric power distribution networks with a voltage less than or equal to 50 kV, referred to as HVA, as an artery cut-off or looped, of which the earthing is unique or distributed, as well as on multisource electric power distribution networks,
  without advanced adjusting for the user (in particular no characteristic angle).

The directional detection of the earth fault according to this invention facilitates the implementation by a basic operator and adapts to the change in neutral point in the case of a change in the operating diagram.

The invention proposes a method for the directional detection of the earth fault applicable to protective relays, but especially to Fault Passage Indicators (FPI), which do not have accurate sensors.

The invention proposes to determine the direction of the fault in the transient phase, not on samples as proposed in document EP 0 845 846, but using the projection of the phasor of the residual current on the phasor of the residual voltage, by integrating the real part of the projection during the transient phase.

The major interest in determining the direction of the fault in the transient phase is that there is no need to adjust the characteristic angle of the projection according to the neutral point of the electrical network. Indeed in the transient phase of the earth fault, the network acts as an isolated neutral network.

According to a preferred characteristic, the number and the frequency of the iterations are chosen according to a splitting of the period of the electric power distribution network in such a way that the iterations are carried out over one network period.

According to a preferred characteristic, the active current is calculated according to the formula:

$$Iactif = \frac{\text{Real}(\vec{IR} \times \vec{VR}^*)}{\|\vec{VR}\|}$$

where $\vec{VR}$ represents the residual voltage phasor, $\|\vec{VR}\|$ the module of the residual voltage phasor and $\vec{IR}$ the residual current phasor.

According to a preferred characteristic, the integral of the active current is calculated by adding together the active current values a number of times equal to the predetermined number of iterations.

The invention also relates to a method for protecting a current line during the appearance of an earth fault, characterised in that it comprises the actuating of a device for cutting off the line whereon an earth fault has been detected by the method for the directional determination of an earth fault such as presented hereinabove.

The invention further relates to a device for the directional determination of an earth fault in an electric power distribution network, characterised in that it comprises:

Means for determining a residual current phasor,

Means for determining a residual voltage phasor,

Means for determining an active current by projection of the residual current phasor on the residual voltage phasor, Means of determining the residual voltage phasor module, Means of comparing the residual voltage phasor module with a threshold, and in that it comprises the following means, able to operate as long as the residual voltage phasor module remains greater than the threshold or greater than a fraction of the threshold, and for a predetermined number of iterations starting from the moment when the residual voltage phasor module is greater than the threshold:

Means for determining the integral of the active current and of the sign of the integral of the active current, Means for determining the residual current phasor module, Means for determining the number of times when the residual current phasor module is greater than a predetermined threshold, during the predetermined number of iterations, Means for determining the location upstream or downstream of the fault according to the number of times when the sign of the integral of the active current was positive or negative during the predetermined number of iterations, if the residual current phasor module is greater than the predetermined threshold at least one time, during the predetermined number of iterations.

The invention also relates to a passage indicator of the earth fault characterised in that it comprises the device presented hereinabove.

The invention also relates to a device for protecting a current line during the appearance of an earth fault, characterised in that it comprises means for actuating a device for cutting off the line whereon an earth fault has been detected by the device for the directional determination of an earth fault presented hereinabove.

The method of protection, the device for determining, the passage indicator of the earth fault, the device for protecting have advantages that are similar to those presented hereinabove.

In a particular embodiment, the steps of the method according to the invention are implemented by computer programme instructions.

Consequently, the invention also relates to a computer programme on an information support, with this programme able to be implemented in a computer, with this programme comprising instructions suited for implementing the steps of a method such as described hereinabove.

This programme can use any programming language, and be in the form of source code, object code, or an intermediary code between source code and object code, such as in a partially compiled form, or in any other desirable form.

The invention also relates to an information support that can be read by a computer, and comprising computer programme instructions suited for implementing steps of a method such as described hereinabove.

The information support can be any entity or device able to store the programme. For example, the support can comprise a means of storage, such as a ROM, for example a CD ROM or a ROM on a microelectronic circuit, or a means of magnetic recording, for example a diskette or a hard drive.

On the other hand, the information support can be a support that can be transmitted such as an electrical or optical signal, which can be carried via an electric or optical cable, by radio or by other means. The programme according to the invention can in particular be downloaded on a network of the Internet type.

Alternatively, the information support can be an integrated circuit wherein the programme is incorporated, with the circuit being adapted to execute or to be used in the execution of the method according to the invention.

BRIEF DESCRIPTION OF THE DRAWINGS

Other characteristics and advantages shall appear when reading the following description of a preferred embodiment given by way of a non-restricted example, described in reference to the figures wherein.

DETAILED DISCLOSURE OF PARTICULAR EMBODIMENTS

Figure 1:
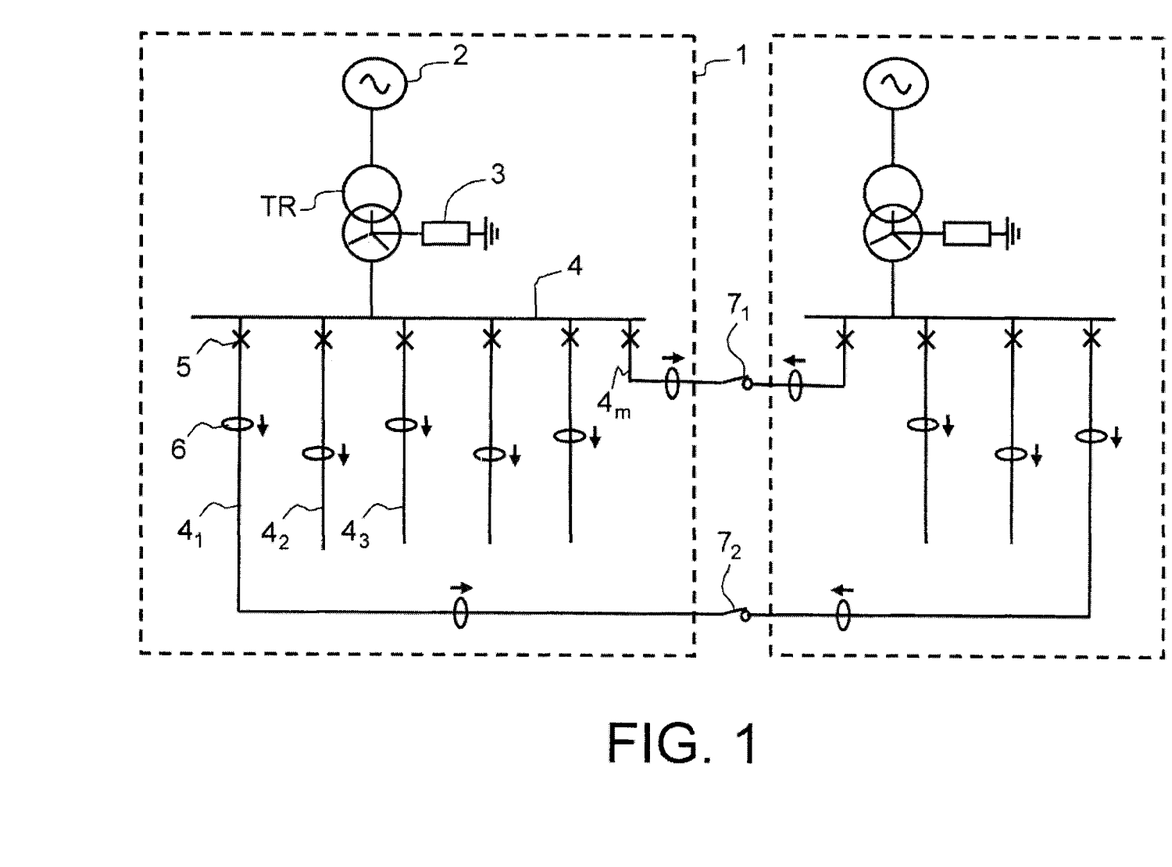
FIG. 1 shows electric power distribution networks provided with devices for directional detection of the earth fault, according to this invention.

According to a preferred embodiment shown in FIG. 1, devices 6 for the directional detection of the earth fault are implemented in a first high-voltage electric power distribution network 1.

The electric power distribution network 1 comprises a voltage source 2 connected to the primary of a three-phase transformer TR of which the secondary can comprise a common neutral conductor generally connected to the earth by an impedance 3.

The secondary of the transformer TR is moreover connected to a main distribution line 4 that supplies a set of m outgoing lines $4_1$, $4_2$, $4_3$, . . . $4_m$ which can respectively comprise at the head a circuit-breaker or other device for cutting-off 5 that protects them.

The outgoing lines $4_1$, . . . , $4_m$ are comprised of overhead lines and/or underground cables. They can be subjected to varied faults, which are important to detect and locate in order to overcome the problems generated: cut-off in power, degradation in the resistance of the insulating materials, without counting the safety of persons. As such, fault detection devices 6 are provided on outgoing lines to serve as a fault passage indicator. The fault passage indicators light for example a lighted indicator. A device can moreover be associated or integrated to a protection relay able to control the opening of the contacts of the circuit breaker 5 of each one of the lines $4_1$ to $4_m$.

Any fault passage indicator 6 detects faults upstream or downstream in relation to the direction of flow of the energy with the receiver convention. This direction is symbolised by an arrow located next to the fault passage indicator.

The electrical network 1 is connected to a second electrical network that comprises similar elements. As such, the line $4_1$ is connected to a line of the second electrical network by the intermediary of a switch $7_2$. Likewise, the line $4_m$ is connected to another line of the second electrical network by the intermediary of a second switch $7_1$.

The invention therefore applies to multisource electric power distribution networks, of which the limiting impedance with the earth is distributed. These are electric power distribution networks as an artery cut-off or looped.

Note that the electric power distribution network can also be connected to an industrial site.

Figure 2:
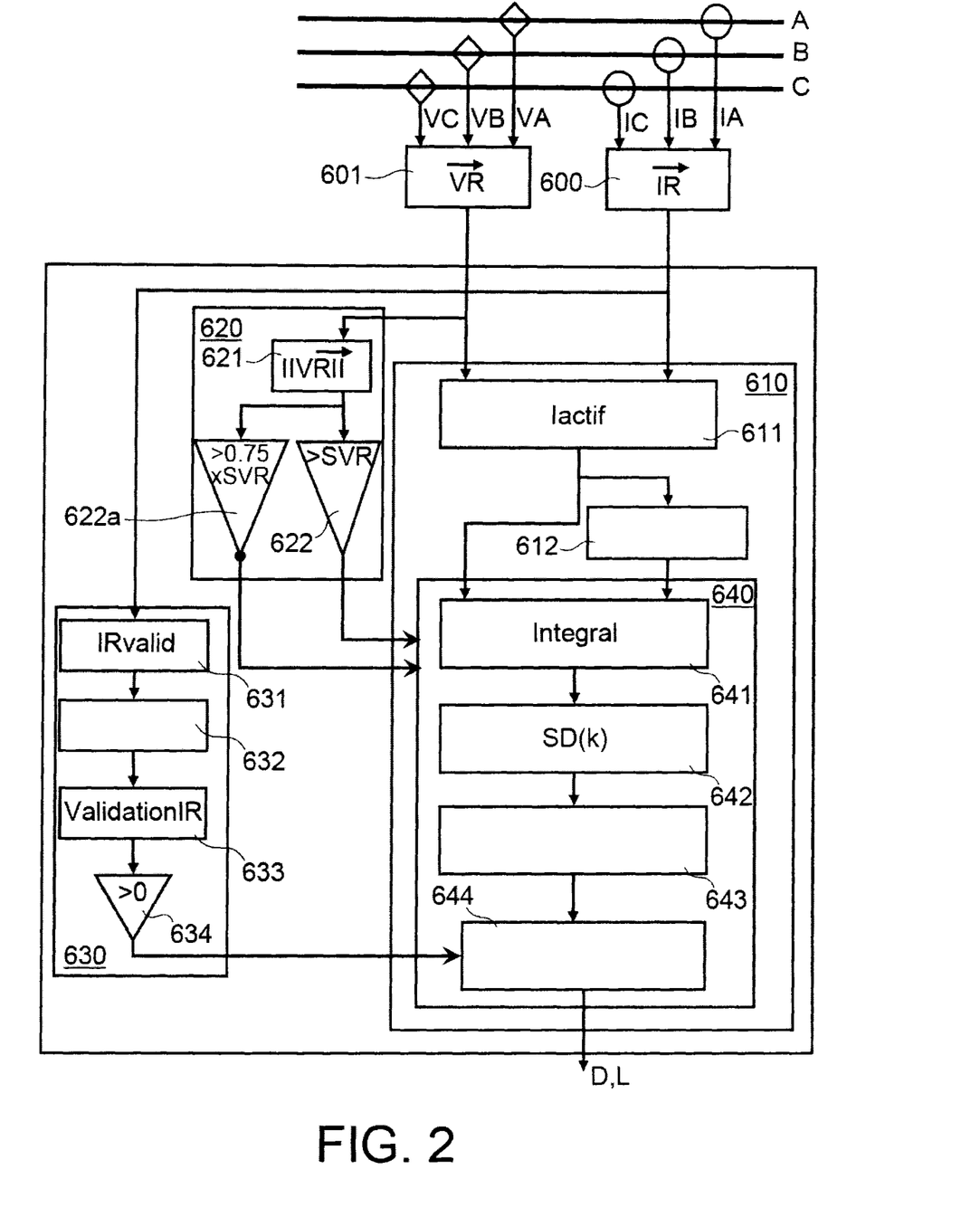
FIG. 2 shows a device for directional detection of the earth fault, according to an embodiment of this invention.

In reference to FIG. 2, a device for directional detection of the earth fault 6 is provided on the three phases of a line of the electric power distribution network. Using the three phases, current sensors are connected to a module 600 for determining the residual current phasor $\vec{IR}$. The residual current phasor is obtained through direct measurement, for example by a homopolar toroid, or by summing together the measurements of the three phase currents IA, IB, and IC.

Still using the three phases, voltage sensors are connected to a module 601 for determining the residual voltage phasor $\vec{VR}$. The residual voltage phasor is obtained for example by adding together the three phase-earth voltages VA, VB, and VC. The voltage sensors do not have to be of great precision. For example, it is possible to use VPIS (Voltage Presence Indicator System) sensors.

Of course, these calculations imply an analogue-to-digital conversion, a filtering and a sampling of measurements. These operations are conventional per se and are not shown or described in order to simplify the disclosure.

The following calculations are carried out by cycle, with each cycle corresponding preferentially to one network period quarter.

The outputs of the modules 600 and 601 are connected to inputs of a calculation module 610.

The output of the module 601 for determining the residual voltage phasor $\vec{VR}$ is also connected to an input of a voltage control module 620.

The output of the module 600 for determining the residual current phasor $\vec{IR}$ is also connected to an input of a current control module 630.

The operation of the calculation module 610, of the voltage control module 620 and of the current control module 630 is as follows.

The voltage control module 620 comprises a sub-module 621 for determining the residual voltage phasor module $\vec{VR}$ connected to a sub-module 622 for verifying if the module of the residual voltage phasor $\vec{VR}$ is greater than a threshold SVR. The threshold SVR is used to trigger the calculations for earth fault detection and for locating the fault in relation to the device. As such, the observation window for fault detection is opened by the voltage. The threshold SVR is for example chosen between 2 kV and 4 kV. Preferably, a hysteresis of 25% is taken into account. In this case, a sub-module 622a for verifying if the residual voltage phasor module $\vec{VR}$ is greater than 0.75 times the threshold SVR is connected in parallel to the sub-module 622.

As shall be seen, the calculations are carried out iteratively. During a first calculation, the threshold SVR is taken into account. For a determined number of following iterations, after the module of the residual voltage phasor $\vec{VR}$ is greater than the threshold SVR, it is the threshold 0.75.SVR which is taken into account, and this as long as the module of the residual voltage phasor $\vec{VR}$ is greater than 0.75 times the threshold SVR.

Preferably, the total number of iterations of the calculations, starting from the moment when the module of the residual voltage phasor $\vec{VR}$ is greater than the threshold SVR, is five. As long as the module of the residual voltage phasor $\vec{VR}$ is greater than 0.75 times the threshold SVR, the five iterations follow one another. Otherwise, the iteration count returns to zero until the module of the residual voltage phasor $\vec{VR}$ is again greater than the threshold SVR.

One iteration, or cycle, of calculation is carried out preferentially every network period quarter.

Of course, it is possible to choose another multiplier coefficient, between 0 and 1, of the threshold SVR in order to take the hysteresis into account. It is also possible to not take the hysteresis into account and therefore to consider the threshold SVR at all of the iterations.

The output of the sub-module 622 and the output of the sub-module 622a are connected to a sub-module 640 of the module 610, which will be described in what follows. These sorties activate the sub-module 640 when the residual voltage phasor module $\vec{VR}$ is greater than the threshold SVR or 0.75 times the threshold SVR, as mentioned hereinabove.

The module 610 comprises as input a sub-module 611 for calculating the current Iactif, according to the formula:

$$Iactif = \frac{\text{Real}(\vec{IR} \times \vec{VR}^*)}{\|\vec{VR}\|}$$

The output of the sub-module 611 is connected to the input of a memory 612 of the FIFO type with five values, with each of the values being updated preferentially every network period quarter. The result of this calculation is memorised in the memory 612.

The outputs of the sub-module 611 and of the memory 612 are connected to the sub-module 640.

When the module 620 activates the sub-module 640, the latter continue the rest of the processing. For this, it comprises as input a sub-module 641 for calculating a variable noted as Integral, according to the following formulas:

$$Integral = \Sigma_1^5 Iactif, \text{ for the first passage} \quad (1)$$

$$Integral = Integral + Iactif, \text{ for the four following passages} \quad (2)$$

Note that for the first passage, the calculation of the variable Integral takes into account the transients in the network period preceding the detection of the module of the residual voltage phasor $\overrightarrow{VR}$ as greater than the threshold SVR.

The output of the sub-module 641 is connected to the input of a sub-module 642 for calculating a variable SD(k) representing the direction of the fault, according to the following formula:

$$SD(k) = sign(Integral)$$

The variable SD(k) is −1 if the sign of the variable Integral is negative and is 1 if it is positive. The variable k represents the number of calculation iterations starting from the moment when the module of the residual voltage phasor $\overrightarrow{VR}$ is greater than the threshold SVR. The variable k therefore varies between 1 and 5, according to the embodiment described.

The output of the sub-module 642 is connected to the input of a memory 643 of the FIFO type with five values, with each of the values being updated preferentially every network period quarter. The variable SD(k) calculated hereinabove is memorised in the memory 643.

The memory output 643 is connected to the input of a sub-module 644 which will be described in what follows.

The current control module 630 receives the values of the residual current phasor $\overrightarrow{IR}$ and comprises a sub-module 631 for calculating a binary variable IRvalid, according to the formula:

$$IRvalid = (\|\overrightarrow{IR}\| > SIR)$$

Where SIR is a current threshold.

This formula means that the binary variable IRvalid is 1 if the threshold SIR is exceeded, and 0 otherwise.

The variable IRvalid is initialised to the value 0 prior to any calculation and when the module of the residual voltage phasor becomes less than 0.75 times the threshold SVR.

The detection of the fault is validated if the module of the phasor of the residual current is greater than the threshold SIR, at least one time during the five iterations. The threshold SIR is for example chosen between 1 A and 5 A.

The output of the sub-module 631 is connected to the input of a memory 632 of the FIFO type with five values, with each value being updated every network period quarter. The variable IRvalid calculated hereinabove is memorised in the memory 632.

The memory output 632 is connected to the input of a sub-module 633 for calculating a variable ValidationIR which is significant of an effective detection of a fault current over the last five cycles, according to the formula:

$$ValidationIR = \Sigma_5 IRvalid$$

The variable ValidationIR is the sum of the variables IRvalid calculated over the last five cycles.

The output of the sub-module 633 is connected to the input of a sub-module 634 for comparing the variable ValidationIR with zero.

If the variable ValidationIR is strictly positive, then the sub-module 634 transmits an activation order to the sub-module 644.

The sub-module 644 calculates the sum of the variables SD(k) calculated and memorised over the last five cycles. The sub-module 644 carries out a test on this sum in order to determine if it is greater than or equal to 3 or if it is less than or equal to −3, in order to determine a piece of information L for locating the earth fault.

When the sum is greater than or equal to 3, then the sub-module 644 delivers a piece of information indicating that the fault is downstream of the device.

When the sum is less than or equal to −3, then the sub-module 644 delivers a piece of information indicating that the defect is upstream of the device.

Note that in these two preceding cases, a piece of detection information D is implicitly associated with the location information L.

In the other cases, the sub-module 644 does not deliver any information for locating the earth fault.

Determining the direction of the fault to the earth is carried out in five cycles separated by a network period quarter, therefore over only the first period of the electrical network following the appearance of the fault.

Of course, it is possible to choose another number of cycles and another frequency for carrying out calculation cycles, and providing more preferably that the determining is carried out over the period of the electrical network following the appearance of the fault. Generally, a network period is divided into (C−1) cycles, with C more preferably odd. The number of iterations is C and C values are memorised in the various memories 612, 632 and 643. The calculation of the adding up of the sub-module 633 is carried out over C values. The calculation of the adding up of the sub-module 641 is carried out over C values. The test carried out by the sub-module 644 is done in relation to the integer greater than C/2.

When an earth fault has been detected on one of the lines $4_1$ to $4_m$, the device for cutting off 5 the line concerned is controlled to be open.

Figure 3:
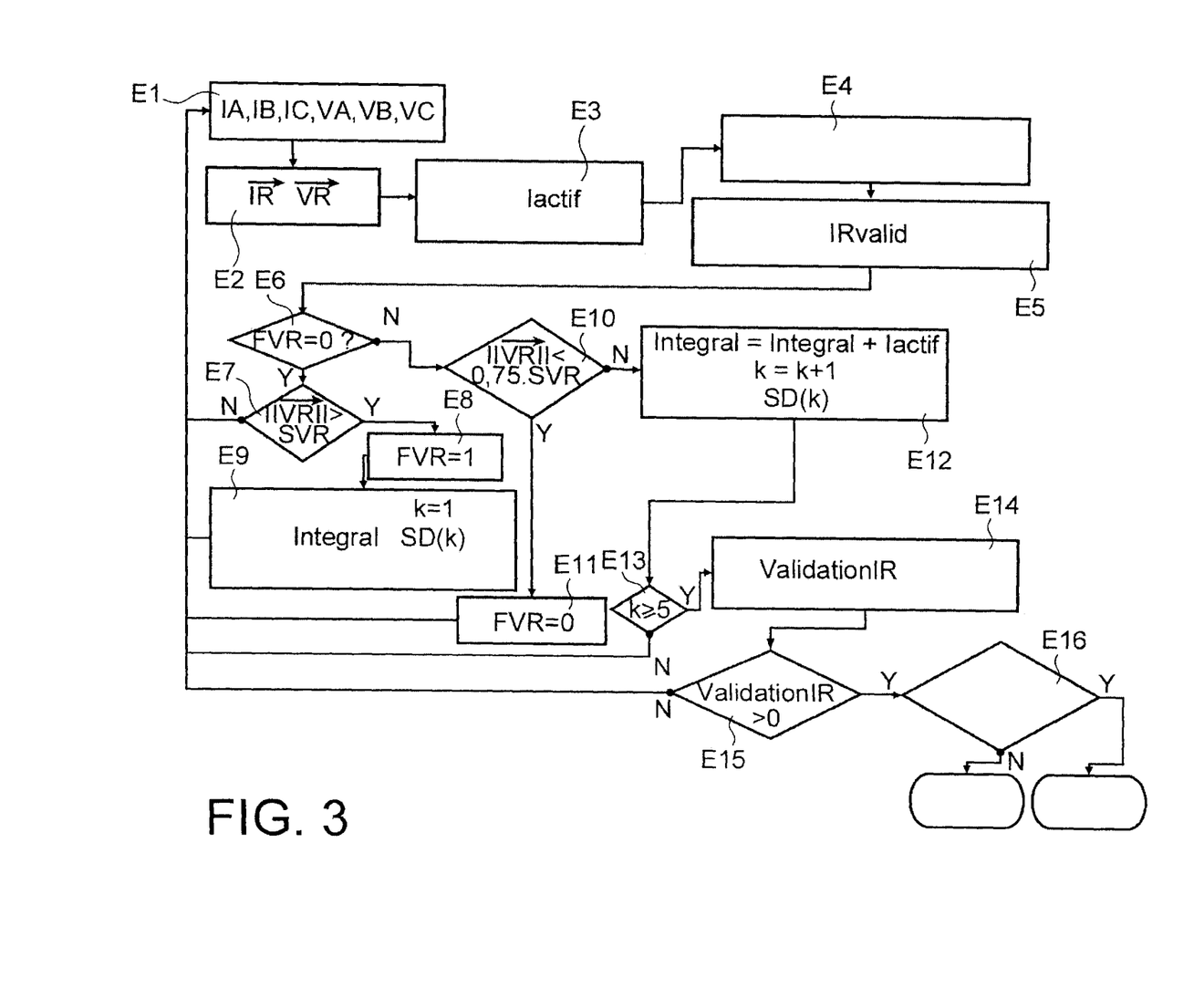
FIG. 3 shows a method for the directional detection of the earth fault, according to an embodiment of this invention.

In reference to FIG. 3, a method for the directional detection of the earth fault implemented in the device described hereinabove comprises steps E1 to E16, for the preferred embodiment comprising five cycles separated by a network period quarter.

The step E1 is the measurement of the three phase currents IA, IB, and IC and of the three phase-earth voltages VA, VB, and VC.

The following step E2 is the determination of the residual current phasor $\overrightarrow{IR}$ and the determination of the residual voltage phasor $\overrightarrow{VR}$.

The following step E3 is the calculation of the current Iactif, according to the formula:

$$Iactif = \frac{Real(\overrightarrow{IR} \times \overrightarrow{VR}^*)}{\|\overrightarrow{VR}\|}$$

The following step E4 is the memorisation of the result of this calculation in the memory 612 of the FIFO type with five values, with each value being updated every network period quarter.

The following step E5 is the determining of the binary variable IRvalid, according to the formula:

$$IR\text{valid} = (\|\vec{IR}\| > SIR)$$

Where SIR is a current threshold.

The binary variable IRvalid is 1 if the threshold SIR is exceeded, and 0 otherwise.

In the step E5, the binary variable IRvalid calculated hereinabove is memorised in the memory 632 of the FIFO type with five values, with each value being updated every network period quarter.

The detection of the fault is validated if the module of the phasor of the residual current is greater than the threshold, at least one time during the five iterations. The threshold SIR is for example chosen between 1 A and 5 A.

The step E5 is followed by the step E6, which is a test in order to determine if a status variable FVR is 0. The status variable FVR takes the value 0 or 1. The status variable FVR is initialised to the value 0 before the step E1.

If the status variable FVR is 0, the step E6 is followed by the step E7 in which the module of the residual voltage phasor is calculated and compared with the threshold SVR.

If the residual voltage phasor module is less than or equal to the threshold SVR, then the step E7 is followed by the step E1 described hereinabove.

If the residual voltage phasor module is greater than the threshold SVR, then the step E7 is followed by the step E8 in which the status variable FVR is set to the value 1 in order to indicate the exceeding of the threshold.

The step E8 is followed by the step E9, in which the variable noted as Integral is calculated, according to the following formula:

$$\text{Integral} = \sum_{1}^{5} I\text{actif}$$

In the step E9, the variable k is initialised to 1 and the variable SD(k) is set to a value that represents the sign of the variable Integral which has just been calculated. The variable SD(k) shows the location of the fault. The variable k represents the number of calculation iterations starting from the moment when the module of the residual voltage phasor $\vec{VR}$ is greater than the threshold SVR. The variable k therefore varies between 1 and 5, according to the embodiment described.

The step E9 is followed by the step E1 described hereinabove.

In the step E6, if the status variable FVR is not 0, this means that the steps E7 to E9 have already been executed. The step E6 is then followed by the step E10 in which the module of the residual voltage phasor is compared to 0.75 times the threshold SVR, in order to take into account a hysteresis phenomenon. Of course, it is possible to choose another multiplier coefficient between 0 and 1 of the threshold SVR or it is possible to not apply a multiplier coefficient to the threshold SVR.

If the residual voltage phasor module is less than or equal to 0.75 times the threshold SVR, then the processing is terminated. The step E10 is followed by the step E11 in which the variable FVR is set to the value 0.

The step E11 is followed by the step E1 described hereinabove.

In the step E10, if the module of the residual voltage phasor is greater than 0.75 times the threshold SVR, then the step E10 is followed by the step E12 in which the variable Integral is updated, according to the following formula:

$$\text{Integral} = \text{Integral} + I\text{actif}$$

In the step E12, the variable k is increased by 1 and the variable SD(k) is set to a value that represents the sign of the variable Integral which has just been calculated.

The variable SD(k) shows the location of the fault.

The step E12 is followed by the step E13 which is a test in order to determine if the variable k is greater than or equal to 5.

When the response is negative, this means that less than five iterations have been carried out since a first exceeding of the threshold SVR observed in the step E7.

The step E13 is then followed by the step E1 described hereinabove.

When the response is positive in the step E13, this means that five iterations have been carried out since a first exceeding of the threshold SVR observed in the step E7. The step E13 is then followed by the step E14 which is the calculation of the variable ValidationIR which is significant of an effective detection of a fault current over the last five cycles, according to the formula:

$$\text{Validation}IR = \sum_{5} IR\text{valid}$$

The variable ValidationIR is the sum of the variables IRvalid calculated over the last five cycles.

The step E14 is followed by the step E15 which is a test in order to determine if the variable ValidationIR is greater than 0.

When the response is negative, this means that a fault current has not been detected over the last five cycles. The step E15 is then followed by the step E1 described hereinabove.

When the response is positive in the step E15, this means that a fault current has been detected over the last five cycles. The step E15 is then followed by the step E16 which is a calculation of the sum of the variables SD(k) calculated and memorised over the last five cycles. The step E16 then comprises a test on this sum in order to determine if it is greater than or equal to 3 or if it is less than or equal to −3, in order to determine a piece of information for locating the earth fault.

When the sum is greater than or equal to 3, then the step E16 delivers a piece of information indicating that the fault is downstream of the device.

When the sum is less than or equal to −3, then the step E16 delivers a piece of information indicating that the fault is upstream of the device.

Note that in these two preceding cases, a piece of detection information is implicitly associated with the location information.

In the other cases, the step E16 does not deliver any information for locating the earth fault.

In the example described, the determination of the direction of the fault to the earth is carried out in five cycles separated by a network period quarter, therefore over only the first period of the electrical network following the appearance of the fault.

As mentioned hereinabove, it is possible to choose another number of cycles and another frequency for carrying out calculation cycles, and providing more preferably that the determining is carried out over the period of the electrical network following the appearance of the fault.

When an earth fault has been detected on one of the lines $4_1$ to $4_m$, the device for cutting off 5 the line concerned is controlled to be open.

Figure 4:
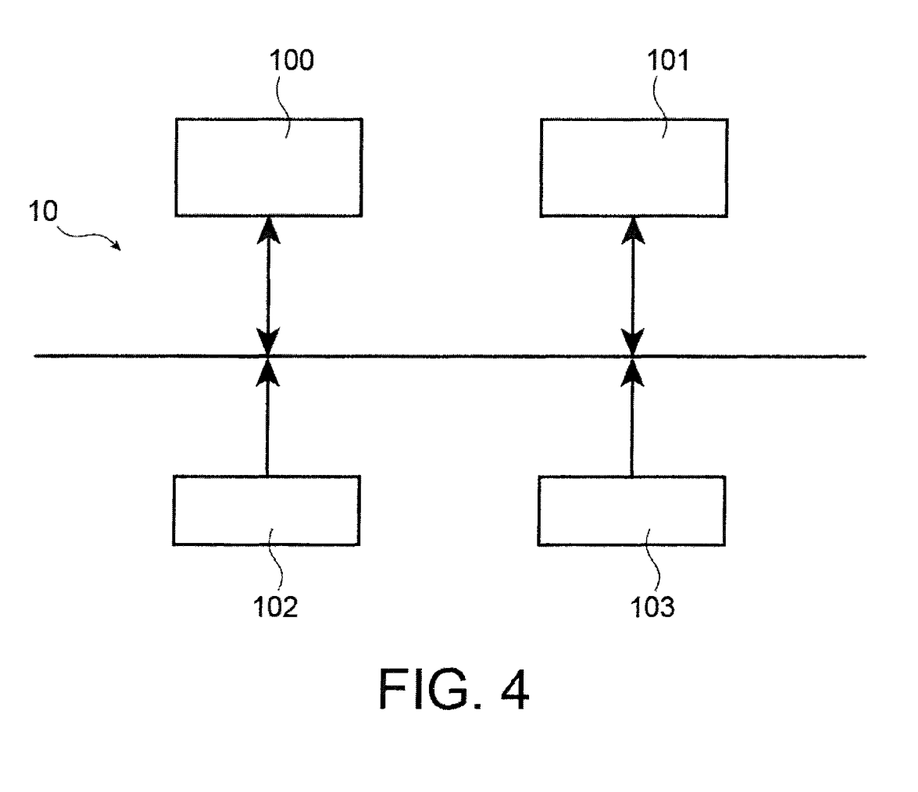
FIG. 4 shows a device for directional detection of the earth fault, according to an embodiment of this invention.

FIG. 4 shows a particular embodiment of the device according to the invention.

The device 6 has the general structure of a computer. It comprises in particular a processor 100 executing a computer programme that implements the method according to the invention, a memory 101, an input interface 102 and an output interface 103 in order to deliver the information on fault detection and the location of the earth fault.

These various elements are conventionally connected by a bus.

The input interface 102 is intended to receive the measured current and voltage values.

The processor 100 executes the processing mentioned hereinabove in reference to FIG. 3. This processing is carried out in the form of code instructions of the computer programme which are memorised by the memory 101 before being executed by the processor 100.

The memory 101 can furthermore memorise the results of the processing carried out.

The output interface 103 can comprise a user interface in order to provide the user with the information concerning the fault detected.

The invention claimed is:

1. A method implemented by a device for the directional determination of an earth fault in an electric power distribution network, comprising:
    determining, by a module that includes a plurality of current sensors each connected directly to a different respective line phase of the electric power distribution network, a residual current phasor,
    determining, by a module that includes a plurality of voltage sensors each connected directly to a different respective line phase of the electric power distribution network, a residual voltage phasor,
    determining an active current by projection of the residual current phasor on the residual voltage phasor,
    determining of the residual voltage phasor module,
    comparing, by processing circuitry of the device, the residual voltage phasor module with a threshold,
    and the method comprises the following steps, as long as the residual voltage phasor module remains higher than the threshold or a fraction of the threshold, and for a predetermined number of iterations starting from the moment when the residual voltage phasor module is greater than the threshold:
    determining the integral of the active current and of the sign of the integral of the active current,
    determining the residual current phasor module,
    determining, by the processing circuitry, the number of times when the residual current phasor module is greater than a predetermined threshold, during the predetermined number of iterations, and
    when the residual current phasor module is greater than the predetermined threshold at least one time, during the predetermined number of iterations, determining, by the processing circuitry, the location upstream or downstream of the defect according to the number of times when the sign of the integral of the active current was positive or negative during the predetermined number of iterations.

2. The method for the directional determination of an earth fault according to claim 1, wherein the number and the frequency of the iterations are chosen in such a way that the iterations are carried out over one network period.

3. The method for the directional determination of an earth fault according to claim 1, wherein the active current is calculated according to the formula:

$$Iactif = \frac{\text{Real}(\vec{IR} \times \vec{VR}^*)}{\|\vec{VR}\|}$$

where $\vec{VR}$ represents the residual voltage phasor, $\|\vec{VR}\|$ the module of the residual voltage phasor and $\vec{IR}$ the residual current phasor.

4. The method for the directional determination of an earth fault according to claim 1, wherein the integral of the active current is calculated by adding together the active current values a number of times equal to the predetermined number of iterations.

5. The method for protecting a current line during the appearance of an earth fault, further comprising actuating of a device for cutting off the line whereon an earth fault has been detected by the method for the directional determination of an earth fault according to claim 1.

6. A device for the directional determination of an earth fault in an electric power distribution network, comprising:
    a plurality of current sensors, each connected directly to a different respective line phase of the electric power distribution network, for determining a residual current phasor,
    a plurality of voltage sensors, each connected directly to a different respective line phase of the electric power distribution network, for determining a residual voltage phasor,
    processing circuitry configured to
    determine an active current by projection of the residual current phasor on the residual voltage phasor,
    determine the residual voltage phasor module,
    compare the residual voltage phasor module with a threshold,
    when the residual voltage phasor module remains higher than the threshold or a fraction of the threshold, and for a predetermined number of iterations starting from the moment when the residual voltage phasor module is greater than the threshold:
        determine the integral of the active current and of the sign of the integral of the active current,
        determine the residual current phasor module,
        determine the number of times when the residual current phasor module is greater than a predetermined threshold, during the predetermined number of iterations, and
        determine the location upstream or downstream of the defect according to the number of times when the sign of the integral of the active current was positive or negative during the predetermined number of iterations, if the residual current phasor module is greater than the predetermined threshold at least one time, during the predetermined number of iterations.

7. A passage indicator of earth fault that it comprises the device for the directional determination of an earth fault according to claim 6.

8. A device for protecting a current line during the appearance of an earth fault, comprising a device for cutting off the line whereon an earth fault has been detected by the device for directional determination of an earth fault according to claim 6.

9. A non-transitory computer readable medium that stores a program that, when executed, causes a device for the directional determination of an earth fault in an electric power distribution network to perform a method comprising:
- determining, by a module that includes a plurality of current sensors each connected directly to a different respective line phase of the electric power distribution network, a residual current phasor,
- determining, by a module that includes a plurality of voltage sensors each connected directly to a different respective line phase of the electric power distribution network, a residual voltage phasor,
- determining an active current by projection of the residual current phasor on the residual voltage phasor,
- determining of the residual voltage phasor module,
- comparing, by processing circuitry of the device, the residual voltage phasor module with a threshold,
- and the method comprises the following steps, as long as the residual voltage phasor module remains higher than the threshold (SVR) or a fraction of the threshold (SVR), and for a predetermined number of iterations starting from the moment when the residual voltage phasor module is greater than the threshold (SVR):
  - determining the integral of the active current and of the sign of the integral of the active current,
  - determining the residual current phasor module,
  - determining, by the processing circuitry, the number of times when the residual current phasor module is greater than a predetermined threshold, during the predetermined number of iterations, and
  - when the residual current phasor module is greater than the predetermined threshold at least one time, during the predetermined number of iterations, determining, by the processing circuitry, the location upstream or downstream of the defect according to the number of times when the sign of the integral of the active current was positive or negative during the predetermined number of iterations.

10. The method for the directional determination of an earth fault according to claim 1, wherein each different respective line phase of the electric power distribution network corresponds to a respective one of multiple outgoing lines of the electric power distribution network, and each of the multiple outgoing lines is configured to connect to a corresponding outgoing line of a second electric power distribution network via a switch, wherein each corresponding outgoing line of the second electric power distribution network also includes a respective device for the directional determination of an earth fault.

* * * * *